US007227265B2

(12) United States Patent
Andricacos et al.

(10) Patent No.: US 7,227,265 B2
(45) Date of Patent: *Jun. 5, 2007

(54) ELECTROPLATED COPPER INTERCONNECTION STRUCTURE, PROCESS FOR MAKING AND ELECTROPLATING BATH

(75) Inventors: Panayotis C. Andricacos, Croton-On-Hudson, NY (US); Steven H. Boettcher, Fishkill, NY (US); Dean S. Chung, Essex Junction, VT (US); Hariklia Deligianni, Edgewater, NJ (US); James E. Fluegel, Rhinebeck, NY (US); Wilma Jean Horkans, Ossining, NY (US); Keith T. Kwietniak, Highlandfalls, NY (US); Peter S. Locke, Hopewell Junction, NY (US); Christopher C. Parks, Poughkeepsie, NY (US); Soon-Cheon Seo, White Plains, NY (US); Andrew H. Simon, Fishkill, NY (US); Erick G. Walton, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 478 days.

This patent is subject to a terminal disclaimer.

(21) Appl. No.: 10/810,719

(22) Filed: Mar. 29, 2004

(65) Prior Publication Data
US 2004/0178078 A1    Sep. 16, 2004

Related U.S. Application Data

(62) Division of application No. 09/684,786, filed on Oct. 10, 2000, now abandoned.

(51) Int. Cl.
*H01L 23/48* (2006.01)
*H01L 23/52* (2006.01)
*H01L 29/40* (2006.01)

(52) U.S. Cl. .................. 257/762; 257/751; 257/752; 257/753; 257/E21.579; 257/E21.584; 257/E21.585

(58) Field of Classification Search ............. 257/751, 257/752, 753, 762
See application file for complete search history.

(56) References Cited

U.S. PATENT DOCUMENTS 5,151,167 A    9/1992  Truong et al.
5,484,518 A    1/1996  Goldberg
6,113,771 A    9/2000  Landau et al.
6,261,433 B1   7/2001  Landau
6,331,237 B1   12/2001 Andricacos et al.
2002/0112964 A1 8/2002 Gandikota et al.
2004/0178077 A1 9/2004 Andricacos et al.

FOREIGN PATENT DOCUMENTS

EP    0952242    11/1998

OTHER PUBLICATIONS

*A Novel Electrolyte Composition for Copper Plating in Wafer Metailization*; Electrochemical Processing in ULSI Fabrication and Semiconductor/Metal Deposition II: Proceedings of the Intenational Symposium; P.C.: Uziel Landau, et al., The Electrochemical Society, Inc. Proceedings vol. 99-9.
*A Model of Superfilling in Damascene Electroplating*; H. Deligianni, et al.; The 195th Meeting of Electrochemical Society, Inc. Meeting Abstracts, vol. 99-1 (May 2-6, 1999).
*Model of Wafer Thickness Uniformity in an Electroplating Tool*; The 195th Meeting of Electrochemical Society, Inc. Meeting Abstracts, vol. 99-1 (May 2-6, 1999).
*A Model of Superfilling in Damascene Electroplating*; H. Deligianni, et al.: Electrochemical Processing in USLI Fabrication and Semiconductor/Metal Deposition II: Proceedings of the International Symposium; P.C.; Uziel Landau, et al., The Electrochemical Society, Inc, Proceedings vol. 99-9.
Uziel Landau, *A Novel Electrolyte Composition for Copper Plating in Wafer Metallization*, Abstract No. 283.
*Model of Wafer Thickness Uniformity in an Electrocoplating Tool*; Electrochemical Processing in ULSI Fabrication and Semiconductor/Metal Deposition II: Proceedings of the International Symposium; P.C.H. Deligiannni, et al., The Electrochemical Society, Inc., Proceedings vol. 99-9.
*Computational Aspects of the Terminal Effect on Wafer-Scale Uniformity*: H. Deligianni et al.; The 195th Meeting of Electrochemical Society, Inc. Meeting Abstracts, vol. 99-1 (May 2-6, 1999).

Primary Examiner—David A. Zarneke
(74) Attorney, Agent, or Firm—Connolly, Bove, Lodge & Hutz, LLP; Robert Trepp

(57) ABSTRACT

Interconnect structures with copper conductors being at least substantially free of internal seams or voids are obtained employing an electroplating copper bath containing dissolved cupric salt wherein the concentration of the salt is at least about 0.4 molar and up to about 0.5 molar concentration of an acid. Also provided are copper damascene structures having an aspect ratio of greater than about 3 and a width of less than about 0.275 µm and via openings filled with electroplated copper than is substantially free of internal seams or voids.

21 Claims, 6 Drawing Sheets

ELECTROPLATED COPPER INTERCONNECTION STRUCTURE, PROCESS FOR MAKING AND ELECTROPLATING BATH

CROSS-REFERENCE TO RELATED APPLICATION

This application is a divisional of application Ser. No. 09/684,786, filed Oct. 10, 2000 now abandoned.

TECHNICAL FIELD

The present invention relates to interconnection wiring on electronic devices such as on integrated circuit (IC) chips and more particularly to substantially void-free and seamless submicron structures fabricated by copper electroplating from novel plating baths.

BACKGROUND OF INVENTION

AlCu and its related alloys are preferred alloys for forming interconnections on electronic devices such as integrated circuit chips. The amount of Cu in AlCu is typically in the range from 0.3 to 4 percent.

Replacement of AlCu by Cu and Cu alloys as chip interconnection material results in advantages of performance. Performance is improved because the resistivity of Cu and certain copper alloys is less than the resistivity of AlCu; thus narrower lines can be used and higher wiring densities will be realized.

The advantages of Cu metallization have been recognized by the semiconductor industry. In fact, the semiconductor industry is rapidly moving away from aluminum and is adopting copper as the material of choice for chip interconnects because of its high conductivity and improved reliability.

Manufacturing of chip interconnects involves many process steps that are interrelated. In particular, copper interconnects are manufactured using electroplating in a process called "Dual Damascene" in which a via and a line are fabricated together in a single step. The electroplating process, typically, employs a plating solution composed of cupric sulfate salt, sulfuric acid, inorganic and organic additives that control the process such that the rate of copper electrodeposition is differentially inhibited along the sidewall of a small feature, resulting in preferential deposition at the bottom wall of the feature.

This phenomenon is called superfilling.

A few of the important integration challenges that need to be overcome to successfully fabricate Dual Damascene copper interconnects are assuring the continuity of the barrier and seed layer films and providing a copper electroplating process capable of producing seamless and void-free deposits at the feature sidewalls and bottom wall of the feature and along the center of the wiring. Furthermore, the *International Technology Roadmap for Semiconductors*, 1999 Edition, calls for smaller via diameters and higher aspect ratios in future interconnect metallizations.

With the shrinking dimensions there is a continuing challenge to fill these features with copper without a seam or void. In Dual Damascene fabrication of features with linewidths of 0.25 µm or smaller, typically a via and a line have to be filled in one process step employing copper electroplating. The applied current is carried through a thin seed copper layer. Often, the seed layer is extremely thin, possibly discontinuous and oxidized and thus it is not capable of carrying the electroplating current reliably within small features of high aspect ratios. In sub-micron vias, which are typically more difficult to fill than lines, the rate of diffusion of the cupric ions dissolved in the plating solution is too low to keep up with the rate of reduction of cupric ions at the metal surface. As a result, the cupric ion concentration within a via becomes much lower than the cupric ion bulk concentration and the concentration overpotential becomes large. The superfilling capability of the plating solution provided by the organic additives cannot overcome the large concentration overpotential caused by the depletion of the cupric ion. These phenomena manifest themselves as voids along the sidewall of the features, two types of defects, caused by missing copper seed layer, and voids or seams along the feature centerline, caused by the depletion of the cupric ion within the via.

Accordingly, there exists a need to provide a copper electroplating process that can accomplish Dual Damascene plating at small features without internal seams or voids.

SUMMARY OF INVENTION

The present invention relates to providing a highly reliable copper interconnect structure suitable for wiring in integrated circuit chips with at least substantially, if not entirely, void-free seamless conductors.

In particular, an aspect of the present invention relates to a process for fabricating an interconnect structure on an electronic device with copper conductor substantially free of internal seams or voids.

The process of the present invention comprises:

forming an insulating material on a substrate, lithographically defining and etching recesses for lines and/or vias in the insulating material in which interconnection conductor material will be deposited, depositing a barrier layer against copper diffusion onto the insulating materials, and into the etched recesses, depositing a copper seed layer for conducting electrical current during electroplating, and depositing the copper conductor by electroplating from an electroplating bath.

The electroplating bath comprises a high copper concentration wherein the concentration of the cupric salt is at least about 0.4 molar and up to the saturation concentration of the cupric salt in solution. In addition, the bath contains an acid and can contain other common components of acid copper plating baths, such as inorganic and organic addition agents.

The copper conductor is deposited by electroplating using an electroplating process in the above electroplating bath wherein the substrate to be plated is introduced into the plating bath with the power supply enabled such that a plating current is imposed at the instant of contact of the substrate with the plating bath. The initially imposed plating current with the power supply engaged is from 1 to 20 mA/cm$^2$ and the time at this lower current density is from 0 to 40 seconds, subsequently the power supply is switched to a higher current density of 10 to about 50 mA/cm$^2$. The initial and final current densities may also be the same so that the substrate is introduced into the plating bath with the same imposed current as the copper plating current.

The present invention also relates to interconnect structures obtained by the above disclosed process.

Another aspect of the present invention relates to a copper electroplating bath that comprises a high concentration of a dissolved cupric salt of at least about 0.4 molar and a low sulfuric acid concentration of at most 0.5 molar and as low as 0.01 molar. In addition, the bath can contain other common components of acid copper plating baths such as inorganic and organic addition agents.

The present invention further relates to a copper damascene structure having an aspect ratio of greater than 3 and a width or diameter of less than 0.275 μm which comprises:

a substrate having a dielectric layer having a via and line opening therein;

the via and/or line opening having a barrier layer on sidewalls and bottom surfaces of the via and/or line opening;

a metal seed layer on the barrier layer; and wherein the via and/or line opening are filled with electroplated copper forming a continuous interface with the liner or barrier layer and being substantially free of internal seams or voids.

Still other objects and advantages of the present invention will become readily apparent by those skilled in the art from the following detailed description, wherein are shown and described preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

Figure 1:
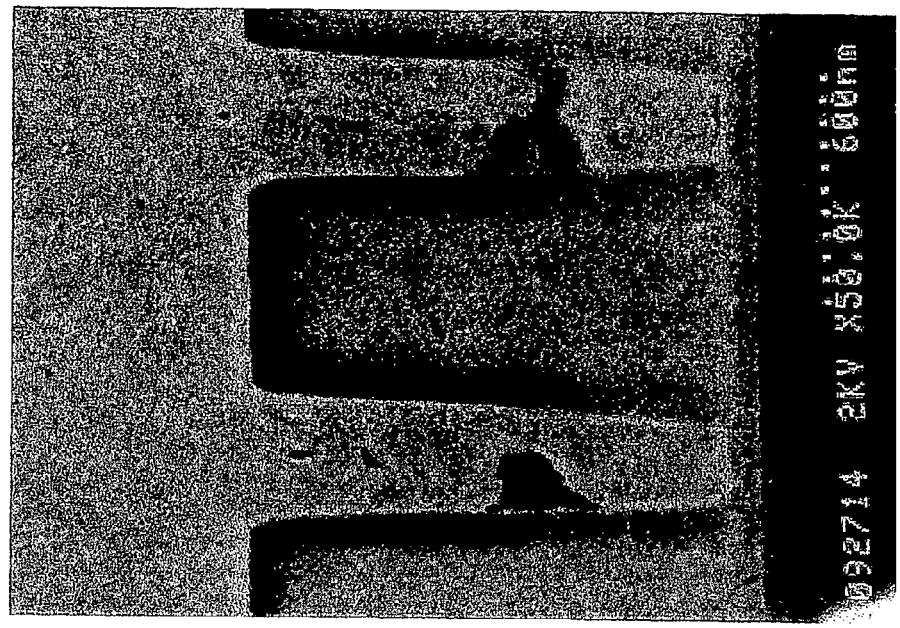
FIG. 1 is a SEM cross section of vias filled with electroplated copper according to prior art method.
Figure 1:
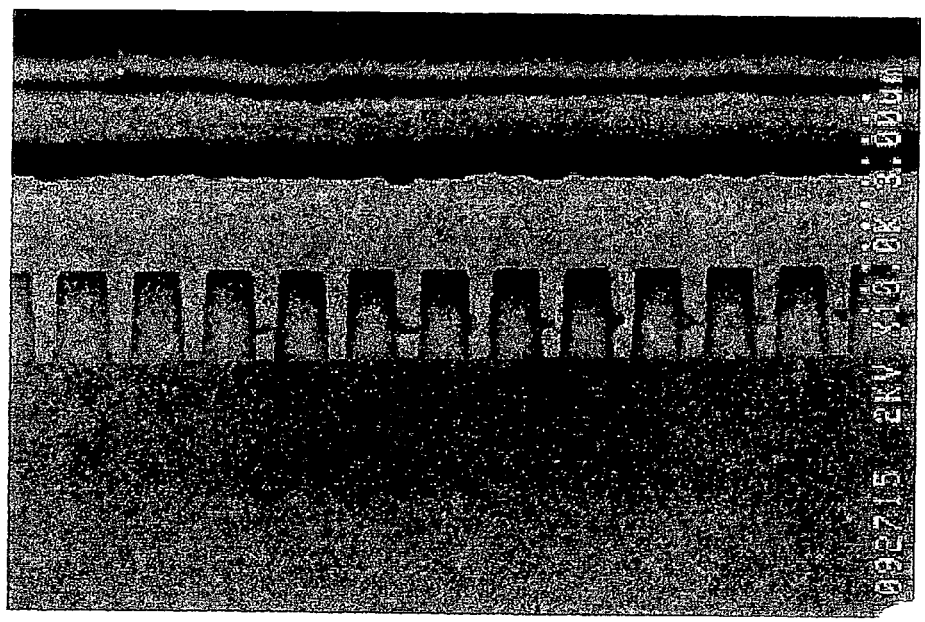

The present invention relates to a process for fabricating an interconnect structure on an electronic device with copper conductors that are substantially, if not entirely, free of internal seams or voids. The fabrication process comprises forming an insulating material such as silicon dioxide on a substrate (e.g. a semiconductor wafer substrate).

Lines and/or vias openings are lithographically defined and formed in the insulating material by well known techniques. According to preferred aspects of the present invention, the lines and/or vias have a width of less than about 0.275 μm, and more preferably about 0.2 μm or less, including widths of about 0.1 μm.

In addition, according to the present invention the lines and/or vias have aspect ratios of greater than about 3.

According to the present invention, copper is deposited in the lines and/or vias by electroplating from a bath containing a dissolved cupric salt wherein the concentration of the cupric salt is at least about 0.4 molar and preferably at least about 0.8 molar. The maximum amount is up to the solubility limit of the salt. The preferred salt is $CuSO_4$. The cupric ion may also be added as sulfamate, hydroxide, carbonate, or other salt that is compatible with the plating bath chemistry and the addition agents. The concentration of the cupric salt is typically about two to four times higher than the concentrations normally used in prior art baths.

The electroplating bath of the present invention can include up to about 0.5 molar of an inorganic acid. The electroplating bath more typically contains an amount up to about 0.5 molar, and preferably about 0.1 to about 0.25 molar concentration of an inorganic acid. The preferred acid is $H_2SO_4$. Alternatively sulfonic acid, methane sulfonic acid, hydrochloric acid or other acids with comparable bath function can be added. The concentration of the acid is typically at least about three to four times lower than the concentration normally used in prior art electroplating baths.

The electroplating bath typically has an acidic pH up to about 5 and preferably about 0.6.

Employing electroplating baths according to the present invention makes possible seamless void-free Dual Damascene copper electrofill that is extendible to 0.10 micron dimensions. Also, such baths provide a wide and robust process window.

The electroplating baths employed according to the present invention preferably are free of complexing agents that are often used in electroplating baths with low acid concentrations.

In addition, the plating baths of the present invention can optionally contain auxiliary additives for achieving superfilling and controlling such properties of the electroplated copper as grain structure, ductility and internal stress. Typical additives and their relative amounts are disclosed in PCT/US96/19592, disclosure of which is incorporated herein by reference.

One suitable system of additives is marketed by Enthone-OMI, Inc. and is known as the Sabre Copper MAke-up. The composition includes two additives one referred to as Sabre B and the other Sabre-L. Two other suitable systems of additives are marketed by ShipleyRonal, Inc. One of them is known as the Copper Gleam 2001 system. The additives are referred to by the manufacturer as Copper Gleam 2001 Leveller and Copper Gleam 2001 Carrier. The other system of additives also marketed by ShipleyRonal Inc. is known as Nanoplate 2001 system, which is a two-additive configuration. One of the additives is referred to as C-2001 Suppressor Solution and the other is referred to as B2001 Additive Solution. Another suitable system of additives is marketed by Atotech USA, Inc. and is known as the Cupracid HS system. The additives in this system are referred to by the manufacturer as Cupracid Brightener and Cupracid HS Basic Leveller.

Examples of specific additives which may be added to a bath in the instant invention are described in several patents. U.S. Pat. No. 4,110,176 issued Aug. 29, 1978 to H-G Creutz, deceased, et al., entitled "Electrodeposition of Copper" describes the use of additives in a plating bath such as poly alkanol quaternary-ammonium salt to give bright, highly ductile, low stress and good leveling copper deposits from an aqueous acidic copper plating bath, which patent is incorporated herein by reference.

U.S. Pat. No. 4,376,685 issued Mar. 15, 1983 to A. Watson, entitled "Acid Copper Electroplating Baths Containing Brightening and Leveling Additives", describes additives to a plating bath such as alkylated polyalkyleneimine to provide bright and leveled copper electrodeposits from an aqueous acidic bath, which patent is incorporated herein by reference.

U.S. Pat. No. 4,975,159 issued Dec. 4, 1990 to W. Dahms, entitled "Aqueous Acidic Bath for Electrochemical Deposition of a Shiny and Tear-Free Copper Coating and Method of Using Same", describes adding to an aqueous acidic bath combinations of organic additives including at least one substituted alkoxylated lactam as an amide-group-containing compound in an amount to optimize the brightness and ductility of the deposited copper, which patent is incorporated herein by reference. In U.S. Pat. No. 4,975,159, Table I lists a number of alkoxylated lactams which may be added to a bath in the instant invention. Table II lists a number of sulfur-containing compounds with water-solubilizing groups such as 3-mercaptopropane-1-sulfonic acid, which may be added to a bath in the instant invention. Table III lists organic compounds such as polyethylene glycol which may be added to a bath as surfactants in the instant invention.

U.S. Pat. No. 3,770,598 issued Nov. 6, 1973 to H-G Creutz, entitled "Electrodeposition of Copper from Acid Baths", describes baths for obtaining ductile, lustrous copper containing therein dissolved a brightening amount of the reaction product of polyethylene imine and an alkylating agent to produce a quaternary nitrogen, organic sulfides carrying at least one sulfonic group, and a polyether compound such as polypropylene glycol, which patent is incorporated herein by reference.

U.S. Pat. No. 3,328,273 issued Jun. 27, 1967 to H-G Creutz et al., entitled "Electrodeposition of Copper from Acidic Baths", describes copper sulfate and fluoborate baths for obtaining bright, low-stress deposits with good leveling properties that contain organic sulfide compounds of the formula $XR_1\text{-}(S_n)\text{—}R_2\text{—}SO_3H$, where $R_1$ and $R_2$ are the same or different and are polymethylene groups or alkyne groups containing 1-6 carbon atoms, X is hydrogen or a sulfonic group, and n is an integer of 2-5 inclusive, which patent is incorporated herein by reference. Additionally, these baths may contain polyether compounds, organic sulfides with vicinal sulphur atoms, and phenazine dyes. In U.S. Pat. No. 3,328,273, Table I lists a number of polysulfide compounds which may be added to a bath in the instant invention. Table II lists a number of polyethers which may be added to a bath in the instant invention.

Additives may be added to the bath for accomplishing various objectives. Additives may be included for inducing in the conductor specific film microstructures including large grain size relative to film thickness or randomly oriented grains.

In addition, prior to the electroplating, a liner or barrier layer is provided on the sidewalls and bottom surfaces of the lines and/or vias. Typical liner or barrier layers include Ti, Ta, W and nitrides thereof. The total thickness of the liner or barrier layer(s) is typically about 0.025 μm to about 0.1 μm.

Located on the surfaces of the liner or barrier layer is typically a metal seed layer such as copper. The seed layer is typically about 0.01 μm to about 0.25 μm thick.

The plating process is preferably carried out by introducing the substrate (e.g. the wafer) into the plating bath with the current on so that the thin and possibly oxidized seed layer is cathodically protected. If the seed layer is oxidized it can be reduced back to copper and repair itself during the hot immersion process.

According to preferred processing of the present invention, the current upon initial immersion of the wafer is lower than that employed in the electroplating such as about 1-5 $mA/cm^2$. The initial current is typically maintained for up to about 40 seconds. If the initial current density employed is lower than the desired electroplating current density, the current density can be increased at this time (after the initial period) to a current density typical of the prior art processes such as between 10 $mA/cm^2$ and 50 $mA/cm^2$. The current can be maintained at the electroplating current density until the desired thickness is achieved.

The lower acid concentration in the bath tends to provide for improved seed layer integrity because the lower acid strength does not have as high tendency to attack or dissolve the copper or oxidized copper seed layer. In addition, the lower acid concentration makes it possible to dissolve the necessary increased concentration of cupric salt in the bath.

The increased cupric ion concentration makes it possible to avoid a large concentration overpotential in high aspect ratio features. In the absence of a large concentration overpotential, the additives can produce superfilling at the center-line of the features and voids will not occur. The high cupric ion concentration in the plating bath also expands the process window of copper electrofill down to 0.1 micron dimensions because it minimizes depletion of the cupric ion within the vias. In essence, a high copper-low acid bath can fill very small width or diameter and high aspect ratio Dual Damascene structures.

The plating is usually carried out at about normal room temperature.

In a typical process, after the electroplating planarizing or chemical-mechanical polishing of the resulting structure is carried out to accomplish electrical isolation of individual lines and/or vias.

The following non-limiting examples are presented to further illustrate the present invention.

EXAMPLE 1

A wafer having 0.25 μm vias with an aspect ratio of about 7 in a silicon dioxide insulating layer having a barrier layer about 0.05 μm thick and a copper seed layer about 0.15 μm thick is immersed in a plating bath containing 124 g/l $CuSO_4.5H_2O$, 49 g/l $H_2SO_4$, about 2 mM HCl, and about 10 ml/l of Sabre-B and about 1.8 ml/l of Sabre-L, commercially available additives from Enthone OMI. A current density of about 3.5 $mA/cm^2$ is applied and the wafer is immersed into the plating bath for about 10 seconds, after which the current is switched to 15 $mA/cm^2$ and the plating continues for about 180 seconds. The wafer is rotated at about 120 rpm.

Figure 4B:
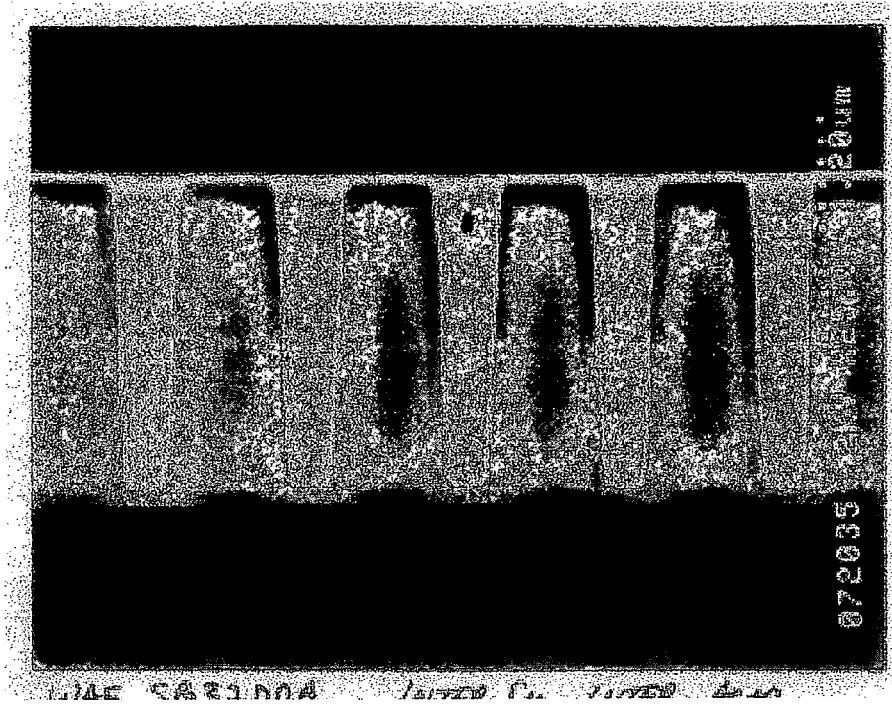
FIGS. 4A and 4B are SEM cross sections of vias filled with electroplated copper according to the present invention.
Figure 4A:
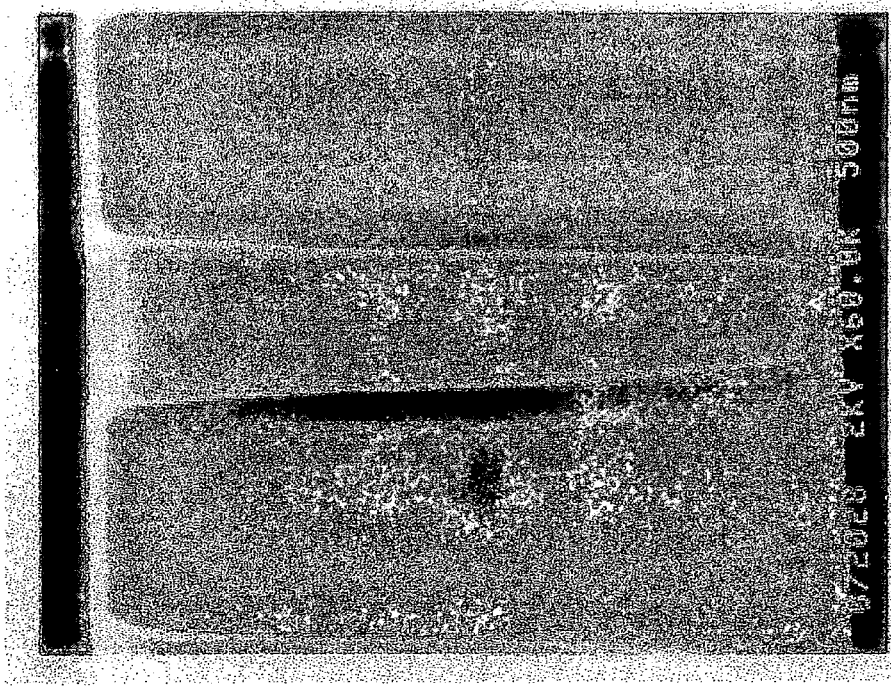

FIGS. 4A and 4B show SEM cross sections achieved by this example. As shown therein, filling of vias was excellent except for one via where a void in the center of the via appeared.

EXAMPLE 2

A wafer having 0.25 μm vias with an aspect ratio of about 7 in a silicon dioxide insulating layer having a barrier layer about 0.05 μm thick and a copper seed layer about 0.15 μm thick is immersed in a plating bath containing about 248 g/l $CuSO_4.5H_2O$, about 24 g/l $H_2SO_4$, about 2 mM HCl, and about 10 ml/l of Sabre-B and about 1.8 ml/l of Sabre-L, commercially available additives from Enthone OMI. Upon immersing the wafer into the bath, the current is switched on to 15 $mA/cm^2$ and plating continues for about 180 seconds. The wafer is rotated at about 120 rpm.

Figure 5B:
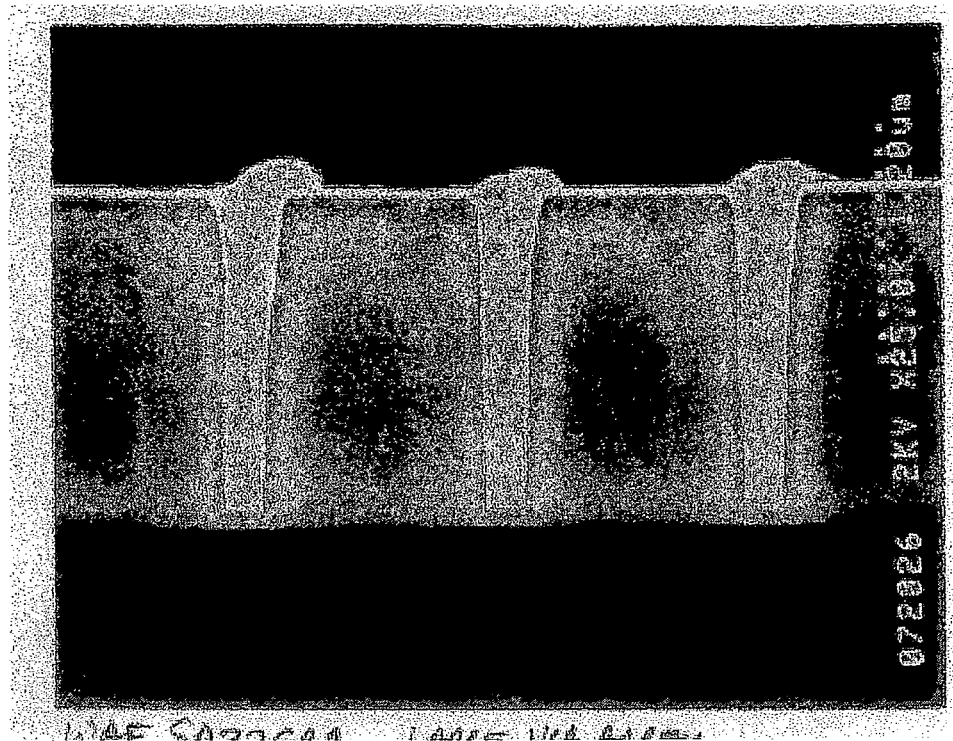
FIGS. 5A and 5B are SEM cross sections of vias filled with electroplated copper according to the present invention.
Figure 5A:
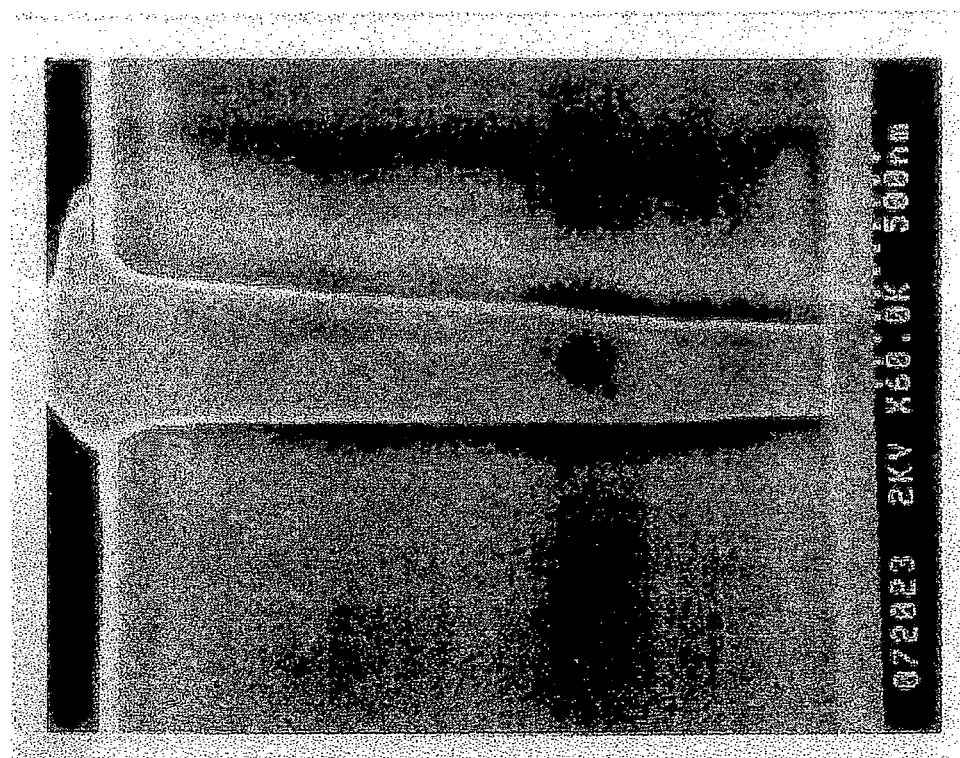

FIGS. 5A and 5B show SEM cross sections achieved by this example. As shown therein, filling of vias was excellent.

EXAMPLE 3

A wafer having 0.25 μm vias with an aspect ratio of about 7 in a silicon dioxide insulating layer having a barrier layer about 0.05 μm thick and a copper seed layer about 0.15 μm thick is immersed in a plating bath containing about 248 g/l $CuSO_4.5H_2O$, about 24 g/l $H_2SO_4$, about 2 mM HCl, and about 10 ml/l of Sabre-B and about 1.8 ml/l of Sabre-L, commercially available additives from Enthone OMI. A current density of about 3.5 mA/cm² is applied and the wafer is immersed into the plating for about 10 seconds, after which the current is switched to 15 mA/cm² and the plating continues for about 180 seconds. The wafer is rotated at about 120 rpm.

Figure 6:
FIG. 6 is a SEM cross section of vias filled with electroplated copper according to the present invention.

FIG. 6 shows a SEM cross section achieved by this example. As shown therein, filling of vias was excellent.

The process of turning the current on before closing the electrical circuit between cathode and anode, prevents the seed layer from dissolving in the acidic plating bath and reduces any oxidized copper formed back to elemental copper. The current density applied can be either the same as the electroplating current density or lower by as much as 15 times. A lower current density than the electroplating current density can be used for cathodic protection of the seed layer and to repair an oxidized seed layer.

The initial current is typically up to about 40 seconds employing a current density of about 1 to about 5 mA/cm².

COMPARISON EXAMPLE A

A wafer having 0.25 μm diameter vias with an aspect ratio of 4.8 is immersed in a plating bath containing 159 g/l sulfuric acid and 60 g/l copper sulfate pentahydrate and the same commercially available additives used in Example 3. The wafer is rotated at 60 rpm and the current is off for 3 seconds while the wafer is in contact with the electroplating solution. A current density of 15 mA/cm² is applied for 180 seconds to electroplate copper.

FIG. 1 shows SEM cross section of vias filled according to this example. There are two kinds of voids observed: voids along the via sidewall and voids along the via centerline. The sidewall voids occur because the copper seed layer at this point on the sidewall was initially thin and was oxidized, the oxide layer then dissolving in the electroplating solution during the 3 second-dwell time. Oxidation of the copper seed layer can occur upon exposure to atmospheric oxygen or moisture.

The other kind of void observed in FIG. 1 is a void along the centerline of the copper deposit. Such voids are attributed to mass transport limitations of the cupric ion within the via and to the resulting large concentration overpotential. Typically additives in the plating solution yield a surface overpotential higher than the cupric ion concentration overpotential, but in high aspect ratio vias or high aspect ratio Dual Damascene structures the cupric ion may be depleted from its bulk value by as much as 85% and the concentration overpotential may become higher than the surface overpotential that produces superfilling.

COMPARISON EXAMPLE B

A wafer having 0.25 μm diameter vias with an aspect ratio of 7 is immersed in a plating bath containing 159 g/l sulfuric acid and 60 g/l copper sulfate pentahydrate and the same commercially available additives used in Example 3. The wafer is rotated at 120 rpm and the current is off for 3 seconds while the wafer is in contact with the electroplating solution. A current density of 15 mA/cm² is applied for 180 seconds to electroplate copper.

Figure 2:
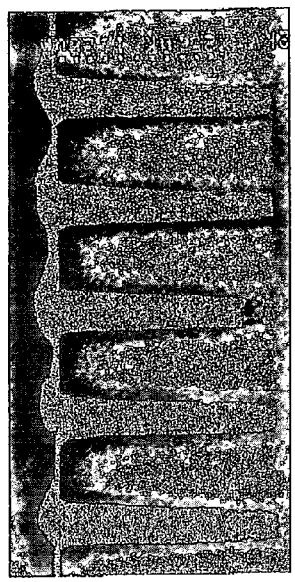
FIG. 2 is a SEM cross section of vias filled with electroplated copper according to prior art method.
Figure 2:
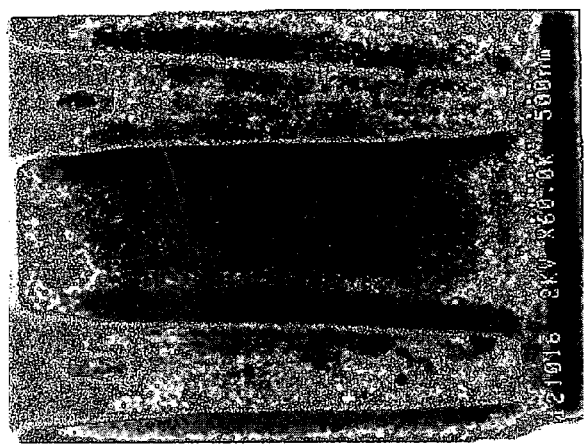
Figure 2:
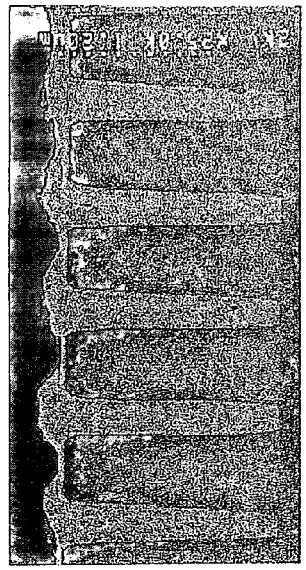
Figure 2:
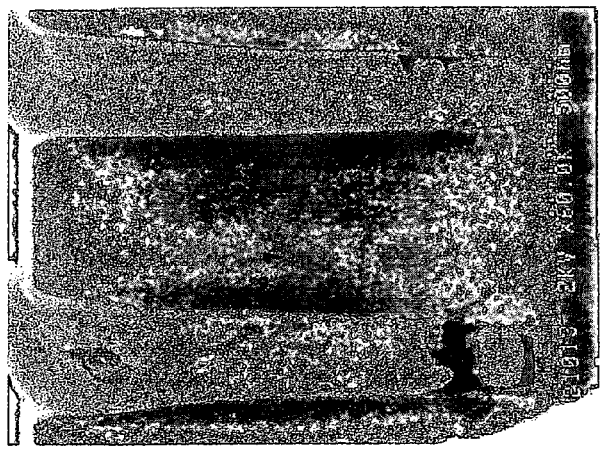

FIG. 2 shows SEM cross sections of vias filled according to this example. The same kinds of voids as present in Comparison Example A are evident in FIG. 2 as well.

COMPARISON EXAMPLE C

A wafer having 0.25 μm vias with an aspect ratio of about 7 in a silicon dioxide insulating layer having a barrier layer of about 0.05 μm thick and a copper seed layer about 0.15 μm thick is immersed in a plating bath containing about 60 g/l $CuSO_4.5H_2O$, about 160 g/l $H_2SO_4$ and the same commercially available additives and amounts used in examples 3-5. A current density of about 3.5 mA/cm² is applied and the wafer is immersed into the plating bath for about 10 seconds, after which the current is switched to 15 mA/cm² and the plating continues for about 180 seconds. The wafer is rotated at about 120 rpm.

Figure 3B:
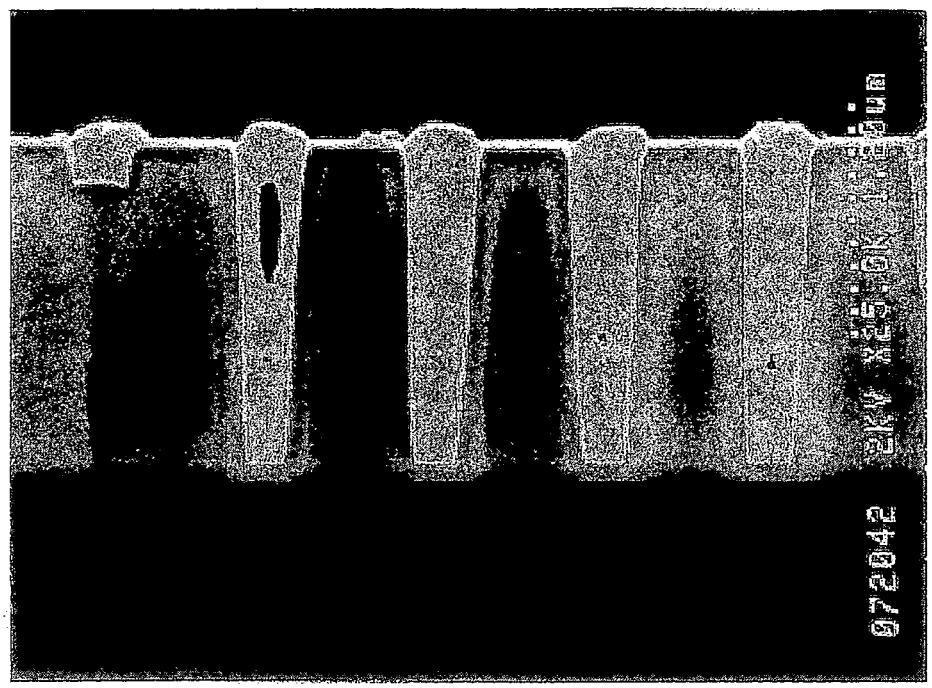
FIG. 3 is a SEM cross section of vias filled with electroplated copper according to prior art.
Figure 3A:

FIGS. 3A and 3B show SEM cross sections achieved by this example. As shown therein, large voids occurred in at least one via and smaller voids in other vias.

Furthermore, the copper deposited in the present invention has properties equivalent to copper deposited from prior art baths. The data in Table 1 below confirm that the resistivity of the copper metal deposited from baths with high cupric sulfate concentration and low sulfuric acid concentration is equivalent to the resistivity of copper deposited from prior art baths.

TABLE 1

| | Final Resistivity of Plated Films | | | |
|---|---|---|---|---|
| (μΩ · cm) | 60/160 $CuSO_4.5H_2O/$ $H_2SO_4$ (g/l) | 126/47.6 $CuSO_4.5H_2O/$ $H_2SO_4$ (g/l) | 223/46 $CuSO_4.5H_2O/$ $H_2SO_4$ (g/l) | 223/26.6 $CuSO_4.5H_2O/$ $H_2SO_4$ (g/l) |
| ρ | 1.79 | 1.82 | 1.81 | 1.88 |

Additionally, there is no dependence of plating efficiency on cupric ion and acid concentrations.

The foregoing description of the invention illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A copper damascene structure having an aspect ratio of greater than about 3 and a width of less than about 0.275 μm which comprises:
   a substrate having a dielectric layer having a via and/or line opening therein;
   the via and/or line opening having a liner or barrier layer on sidewalls and bottom surfaces of the via opening;
   a metal seed layer on the liner or barrier layer; and
   wherein the via and/or line opening is filled with electroplated copper that forms a continuous interface with the liner or barrier layer and being substantially free of internal seams or voids.

2. An interconnect structure obtained by the process which comprises:

forming an insulating material on a substrate;

lithographically defining and forming recesses for lines and/or vias in the insulating material in which interconnection conductor material will be deposited;

depositing a barrier layer against copper diffusion;

depositing a current carrying copper seed layer;

depositing the copper conductor by electroplating from a bath containing a dissolved cupric salt wherein the concentration of the cupric salt is at least about 0.4 molar and an acid and wherein the bath has an acidic pH.

3. An electroplating copper bath comprising dissolved cupric salt at a concentration of at least about 0.4 molar, up to about 0.5 molar concentration of an acid and having an acidic pH.

4. The interconnect structure of claim 2 wherein the concentration of the cupric salt is at least about 0.8 molar.

5. The interconnect structure of claim 2 wherein the cupric salt comprises $CuSO_4$.

6. The interconnect structure of claim 2 wherein the concentration of the acid is a positive amount up to about 0.5 molar.

7. The interconnect structure of claim 2 wherein the concentration of the acid is about 0.1 to about 0.25 molar.

8. The interconnect structure of claim 2 wherein the acid is sulfuric acid.

9. The interconnect structure of claim 2 wherein the electroplating bath has a pH of up to about 5.

10. The interconnect structure of claim 2 wherein the electroplating bath has a pH of about 1.

11. The interconnect structure of claim 2 wherein the electroplating bath contains at least one auxiliary additive selected from the group consisting of brightener, leveling agent, ductility enhancer and stress reducer.

12. The interconnect structure of claim 2 wherein the electroplating bath is free of complexing agents.

13. The interconnect structure of claim 2 wherein the substrate is coupled to a plating power supply with the current on upon introducing the substrate into the bath.

14. The interconnect structure of claim 13 wherein the initial current of the power supply is lower than the current of the electroplating of copper from the bath onto the substrate.

15. The interconnect structure of claim 14 wherein the initial current is maintained for up to about 30 seconds.

16. The interconnect structure of claim 2 wherein the electroplating is carried out at a current density of about 10 to about 30 $ma/cm^2$.

17. The interconnect structure of claim 15 wherein the initial current is about 3-4 $ma/cm^2$.

18. The interconnect structure of claim 2 which further comprises a barrier layer on sidewalls and bottom surfaces of the lines or vias, and a metal seed layer beneath the copper.

19. The interconnect structure of claim 18 wherein the metal seed layer comprises copper.

20. The interconnect structure of claim 2 wherein the vias or lines have dimensions of about 0.275 µm or less and aspect ratios of at least about 3.

21. The interconnect structure of claim 2 wherein the copper is planarized or polished.

* * * * *